United States Patent [19]

Tsutsui

[11] Patent Number: 4,924,258
[45] Date of Patent: May 8, 1990

[54] MASK HOLDER AND A MASK CONVEYING AND HOLDING MECHANISM USING THE SAME

[75] Inventor: Shinji Tsutsui, Kawasaki, Japan

[73] Assignee: Canon Kabushiki Kaisha, Tokyo, Japan

[21] Appl. No.: 218,137

[22] Filed: Jul. 13, 1988

[30] Foreign Application Priority Data

Jul. 30, 1987 [JP] Japan .................................. 188816

[51] Int. Cl.$^5$ ...................... G03B 27/42; G03B 27/62; B25B 11/00
[52] U.S. Cl. ........................................ 355/53; 355/75; 355/76; 269/21
[58] Field of Search .............. 269/21; 279/4; 414/416; 355/53, 30, 75, 76

[56] References Cited

U.S. PATENT DOCUMENTS

| | | | |
|---|---|---|---|
| 2,995,979 | 8/1961 | Gordon et al. | 355/75 |
| 3,476,476 | 11/1969 | Chitayat | 355/53 X |
| 3,497,705 | 2/1970 | Adler | 355/53 X |
| 4,544,311 | 10/1985 | Husain | 269/21 X |
| 4,583,847 | 4/1986 | Battig et al. | 355/53 |
| 4,784,377 | 11/1988 | Woodward | 269/21 |

Primary Examiner—Donald A. Griffin
Attorney, Agent, or Firm—Fitzpatrick, Cella, Harper & Scinto

[57] ABSTRACT

A mask holder and a mask conveying and holding mechanism using the same, effectively usable in an exposure apparatus for printing a pattern of a mask or reticle on a workpiece such as a semiconductor wafer or a plate-like member made of glass or cermaics, is disclosed. In one preferred form, the mask holder has three positioning rollers, two spring-biased pressing rollers for pressing two side faces of a mask so that other two side faces of the mask abut against the positioning rollers, and two spring-biased pressing members for pressing an upper face of the mask so that a lower face of the mask abuts against a lower end face of a mask accommodating portion of the holder. With this arrangement, the mask can be held as a unit with the holder during conveyance. Also, the holder and a mask stage of the exposure apparatus may be arranged so that the mask can be held on the stage by vacuum suction.

8 Claims, 3 Drawing Sheets

MASK HOLDER AND A MASK CONVEYING AND HOLDING MECHANISM USING THE SAME

FIELD OF THE INVENTION AND RELATED ART

This invention relates generally to an exposure apparatus for photolithographically transferring a pattern formed on a mask or reticle (hereinafter simply "mask") onto a workpiece such as a semiconductive plate member or a glass or ceramic plate member. More particularly, the invention is concerned with a mask holder, usable with such an exposure apparatus, for holding a mask thereon. In another aspect, the invention is concerned with a mask conveying and holding mechanism, usable in such an exposure apparatus, for conveying and holding masks by use of mask holders.

Usually, in an exposure apparatus of the type described above, an original, such as a mask on which a pattern is formed, is placed on a mask stage which is provided in the course of an optical path extending from a light source to a plate-like workpiece, such as a semiconductor wafer or a glass base plate. The mask and the workpiece are mutually aligned and, thereafter, an ultraviolet light is supplied along the optical path, with the result that the mask pattern is transferred onto the plate-like workpiece. In this type of exposure apparatus, an original such as a mask, for example, should be conveyed to and held on the mask stage by use of any suitable means. Conventionally, an operator or a mechanical means directly grips a portion of a mask to supply the same onto the mask stage. With this conveying method, however, there is a possibility of damaging the mask. Additionally, there is a possibility of creation of dust or particles at the portion contacted by the hand of the operator or the mechanical means. If such a particle adheres to the pattern region of the mask, the exposure performance is easily deteriorated.

Usually, vacuum attraction is used as a means for holding a mask on a mask stage. Since the attracting surface to which a mask is attracted is usually made of metal, the repetition of mask mounting and demounting (loading and unloading) easily causes scratches on the mask.

Recently, on the other hand, the photolithography technique described above has been applied to the manufacture of liquid crystal TV display panels. Liquid crystal panels for such display devices do not have a standardized size or sizes, as compared with the semiconductor wafers. Therefore, it is necessary to prepare many varieties of masks having different sizes. Accordingly, with the conventional mask holding method wherein a mask is directly held by the mask stage by attraction, it will be necessary to change the attracting portion of the mask stage each time a mask of a different size is used. This is inconvenient.

SUMMARY OF THE INVENTION

It is accordingly a primary object of the present invention to provide a mask holder and a mask conveying and holding mechanism using the same, by which a mask can be conveyed and held substantially without the possibility of the damage of the mask and the possibility of creation of dust or particles; and by which different masks having different sizes can be easily handled without changing the structure of an exposure apparatus such that improved versatility is assured.

Briefly, in accordance with one aspect of the present invention, to achieve the above object, there is provided a mask holder usable in an exposure apparatus for printing a pattern of a mask upon a workpiece and also being usable for conveying and holding the mask, said mask holder comprising:

a reference member operable as a reference for the positioning of the mask;

an aperture formed in said mask holder and being adapted to be used when the mask is attracted by vacuum;

a spring-biased first pressing member operable to press a side of the mask, when it is held by said mask holder, in a direction contacting another side of the mask to said reference member; and a spring-biased second pressing member operable to press an upper face of the mask, when it is held by said mask holder, in a direction contacting a lower face of the mask to said aperture.

With the described structure of the mask holder, a mask can be held as a unit with the mask holder and thus the mask can be conveyed while being held as a unit with the mask holder. Additionally, when a mask is held fixed at an exposure station, relative to a mask stage, the mask can be vacuumattracted with the intervention of the mask holder.

In one preferred form of the invention, a mask holder is provided with spring-biased first pressing members which are effective to press side faces of a mask, when it is held by the mask holder, so that other side faces of the mask abut against a positioning reference; and spring-biased second pressing members which are effective to press the upper face of the mask, when it is held by the mask holder, so that the lower or bottom face of the mask abuts against the bottom of a mask accommodating portion of the mask holder.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
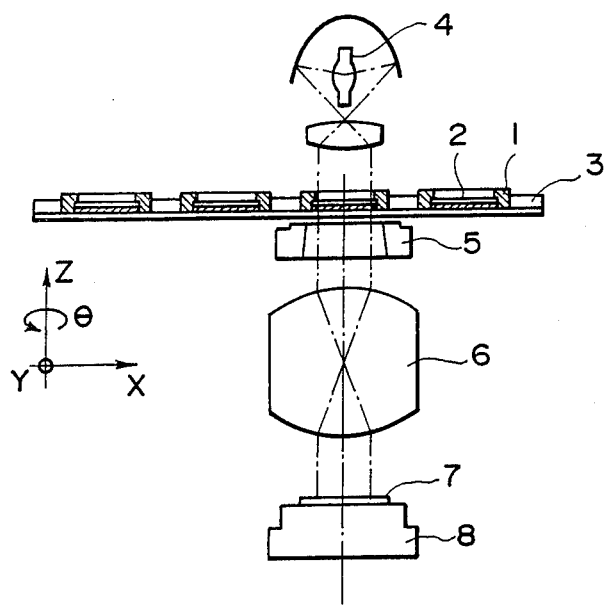
FIG. 1 is a schematic view of an exposure apparatus into which a mask conveying and holding mechanism according to an embodiment of the present invention is incorporated.

Referring first to FIG. 1, there is schematically shown an exposure apparatus to which the present invention is applied. Denoted in FIG. 1 at numeral 1 are mask holders each being used continuously to hold a mask continuously; at 2, masks held by the mask holders; at 3, a mask conveying table on which four masks 2 accommodated in the mask holders 1, respectively, can be carried; at 4, a light source used as an exposure energy source; at 5, a mask stage adapted to position a mask holder 1 on the path of the light from the light source 4 and being movable in each of X, Y and $\theta$ (rotational) directions; at 6, a projection optical system; at 7, a plate-like workpiece such as a wafer or a glass plate, for example, which is an object to be exposed to the light from the projection optical system 6; at 8, a movable stage for carrying thereon the workpiece 7 and being movable in each of X, Y, Z and $\theta$ directions. When a mask 2 held on the mask stage 5 with the intervention of a corresponding mask holder 1 is illuminated by the light from the light source 4, a pattern formed on that mask 2 is projected by the projection optical system 6 upon the workpiece 7, whereby the mask pattern is printed on the workpiece 7.

Figure 2:
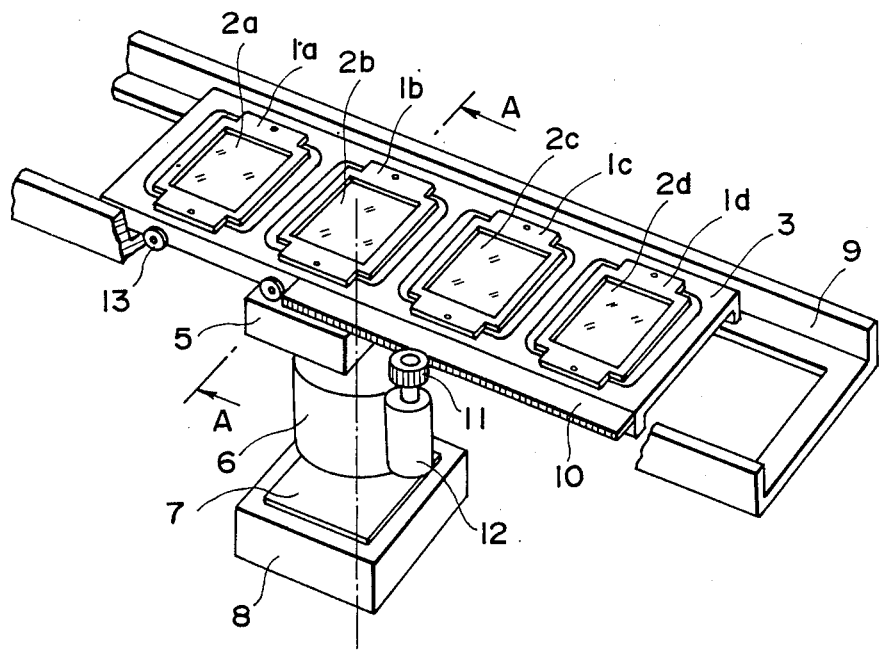
FIG. 2 is a fragmentary and perspective view of a mask conveying and holding mechanism according to an embodiment of the present invention.

FIG. 2 is a perspective view showing the structure of a mask conveying and holding mechanism usable in the exposure apparatus of the FIG. 1 example. Placed on a mask conveying table 3 are masks 2a–2d each being held by corresponding one of mask holders 1a–1d. These masks 2a–2d are conveyed onto a mask stage 5 in a predetermined sequence. Rollers 13 are mounted to the conveying table 3. By the action of these rollers 13, the conveying table 3 can slide smoothly on a guide rail 9. Fixedly mounted to the conveying table 3 is a rack 10 which is adapted to be driven by a driving motor 12, having a rotary encoder contained therein, through a pinion gear 11. Thus, by the actuation of the driving motor 12, the conveying table 3 is moved. Each of the mask holders 1a–1d is positioned on the conveying table 3 without "play" by means of positioning pins 31a and 31b (see FIG. 4) provided on the conveying table 3.

Figure 3:
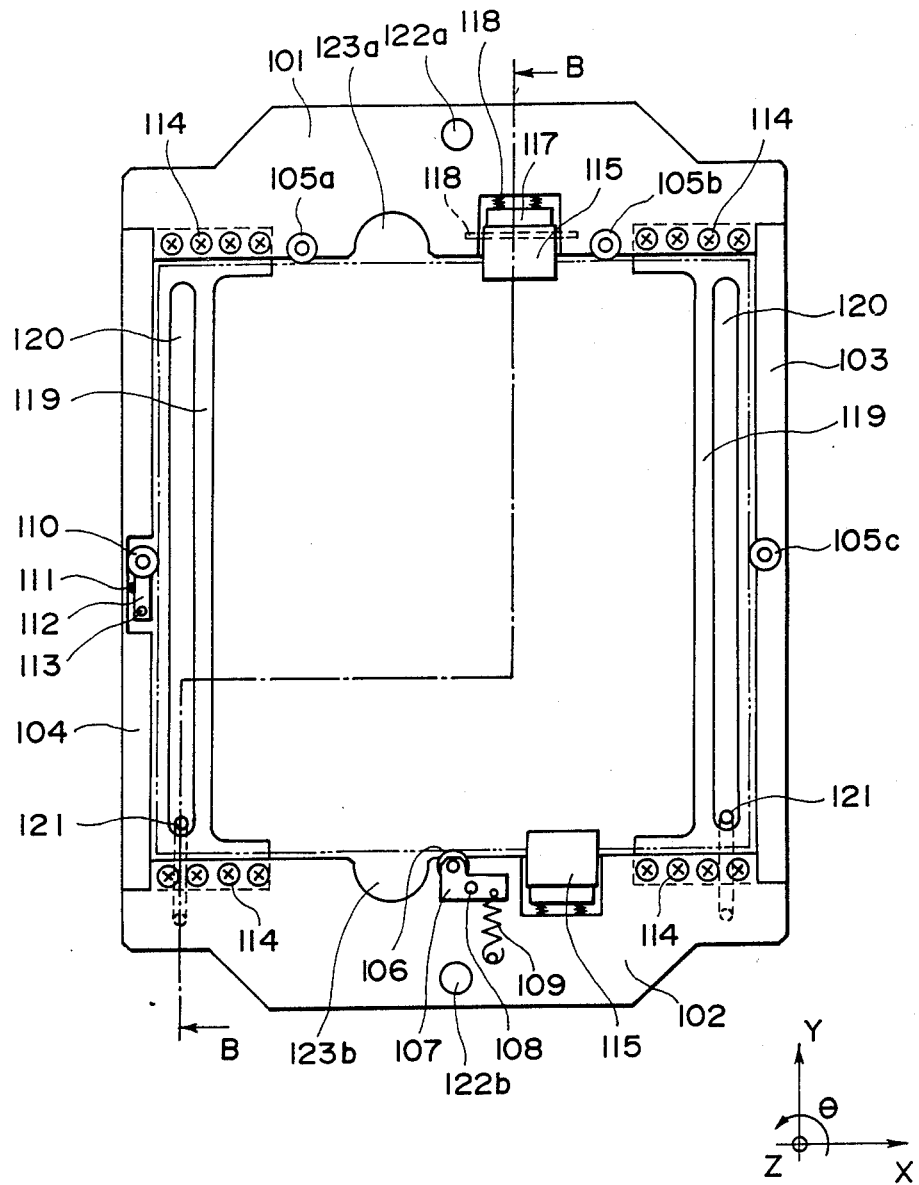
FIG. 3 is a top plan view of a mask holder according to an embodiment of the present invention.
Figure 4:
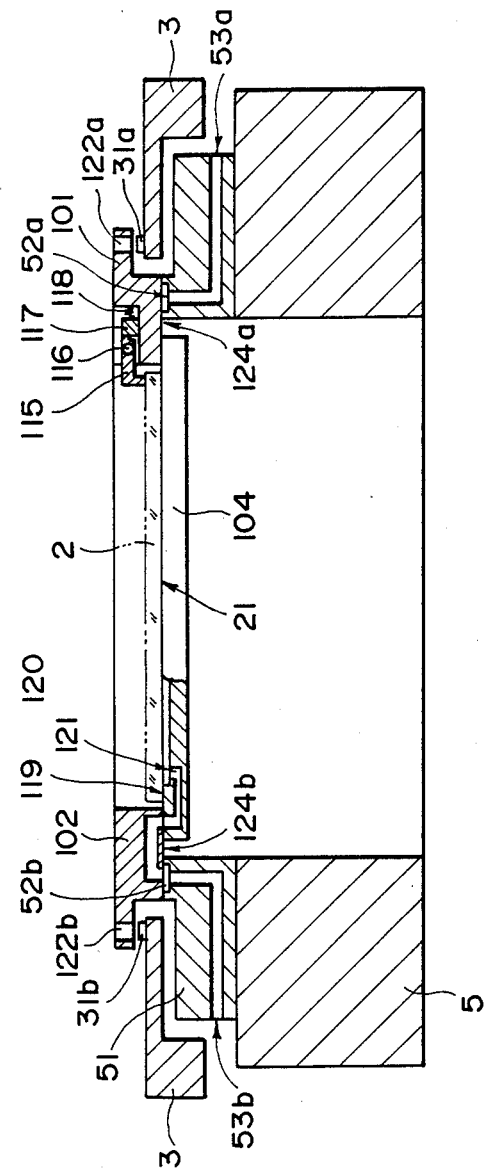
FIG. 4 is a vertical section of a mask stage on which a mask holder of the present invention is placed.

FIG. 3 shows details of a mask holder. FIG. 4 is a section of the mask stage 5, taken on a line A—A in FIG. 2. In FIG. 4, a mask holder held by the mask stage is illustrated in a section taken on a line B—B in FIG. 3.

Generally, a mask holder 1 comprises four segments, namely, two transverse frames (upper and lower frames 101 and 102 in the FIG. 3 example) and two longitudinal frames (right-hand and left-hand frames 103 and 104), which are coupled by screws 114 to provide an integral structure. The upper frame 101 is provided with mask positioning stopper rollers 105a and 105b, while the right-hand frame 103 is provided with a similar mask positioning stopper roller 105c. When a mask 2 of rectangular shape is held by this mask holder 1, one side of the mask 2 engages with the stopper rollers 105a and 105b, while an adjacent side of the mask 2 engages with the stopper roller 105c. More specifically, by the function of pressing rollers 106 and 110, the mask 2 is pressed against the stopper rollers 105a, 105b and 105c (opposed to the pressing rollers 106 and 110) from the remaining two sides of the mask 2 (opposed to the sides of the mask engaging the stopper rollers), with a required minimum force. The pressing rollers 106 and 110 are supported by arms 107 and 112, respectively, each arm being swingable about a rotational shaft 108 or 113. Tension coiled spring 109 produces the pressing force of the pressing roller 106 in the Y direction, while a compressed coiled spring 111 produces the pressing force of the pressing roller 110 in the X direction. Further, the upper and lower frames 101 and 102 are provided with pressing levers 115, respectively, by which the mask 2 is restrained with respect to the Z direction, which is a direction perpendicular to the plane of the mask. The pressing lever 115 is rotatable about a rotational shaft 116, and the combination of a compressed coiled spring 118 and a pressing block 117 produces a downward pressing force of the pressing lever, as viewed in the drawing. Upon loading and unloading of the mask, the pressing lever 115 is swingable so that it is erected perpendicularly to the mask loading plane. Therefore, it does not interfere with the loading and unloading of the mask. For facilitating the loading and unloading of the mask 2, the upper and lower frames 101 and 102 are formed with notches 123a and 123b to allow access of operator's fingers.

In the manner described hereinbefore, usually a mask is held immovable within a mask holder 1. The loading of a mask 2 onto a mask holder 1 is effected at the outside of an exposure apparatus. A mask 2 being held by a mask holder in the described manner is conveyed to the exposure apparatus with the operator's hand or by a mechanical means, without being directly contacted by the operator's hand or the mechanical component of the mechanical means. The mask holder 1 as conveyed to the exposure apparatus is positioned by means of the pins 31a and 31b provided on the conveying table 3. Subsequently, the mask holder 1 is conveyed onto the mask stage 5 by the conveying table 3 and, then, is placed on a mask chuck 51 (see FIG. 4), which is fixedly provided on the mask stage 5, by means of a vertically moving mechanism (not shown) operable to move the conveying table 3 in the Z direction. In this state wherein the mask holder 1 is placed on the mask chuck 51, the pins 31a and 31b are at positions disengaged from reference bores 122a and 122b, respectively, formed in the mask holder 1. The mask chuck 51 has formed therewithin exhaust passageways 53a and 53b which are communicated with attracting grooves 52 and 52b, respectively, formed on the surface of the mask chuck. Accordingly, by coupling these exhaust passageways 53a and 53b to a vacuum source (not shown), the mask holder 1 can be attracted to and held by the mask chuck 51, by vacuum suction. Simultaneously, the vacuum pressure is supplied by way of exhaust passageways 121 formed in the mask holder 1 to attracting grooves 120 formed on the mask holder 1, such that the mask 2 is attracted to an attracting surface 119 of the mask holder 1. By this, a pattern bearing surface 21 of the mask 2 can be held in the same plane as or coplanar with the attracting surface of the mask chuck 51.

However, to assure this, it may be necessary to finish the surfaces 119, 124a and 124b with the flatness of an order of 2–3 microns.

In accordance with the present invention, as has hitherto been described, a mask can be accommodated in a mask holder and, in this state, the mask now being held as a unit with the mask holder can be conveyed to and placed immovable on a mask stage of an exposure apparatus, for example. This allows easy setting of a mask at a predetermined or desired position, independently of the size of the mask. Similarly, the present invention can facilitate the holding of a mask or masks also within a mask keeping room or a mask cleaning apparatus. Namely, in accordance with the present invention, each mask can be conveyed while being accommodated in a mask holder. Therefore, it is possible to notably reduce the possibility of, e.g., damage of the mask and/or adhesion of particles to the mask due to accidental contact of a conveying belt, a conveying hand or otherwise to the mask. Additionally, the handling of different masks having many varieties of sizes can be facilitated without modifying the apparatus such as an exposure apparatus, for example, with which the masks are used. Further, in relation to identification symbols such as a mask No., for example, it is possible to directly write such an idenitification symbol upon a portion of the mask holder or, alternatively, a label may be adhered to the mask holder. This is effective to prevent incorrect selection of masks.

Particularly, with a mask holder according to the present invention, it is not necessary to secure a mask to the mask holder by use of fixing means such as screws or otherwise, upon mounting of the mask onto the mask holder. Therefore, the replacement of the mask in each mask holder is easy. Further, the possibility of unwanted flexure of the mask, the creation of dust or particles, etc. resulting from the pressing of the mask by screws or otherwise, can be avoided.

While the invention has been described with reference to the structures disclosed herein, it is not confined to the details set forth and this application is intended to cover such modifications or changes as may come within the purposes of the improvements or the scope of the following claims.

What is claimed is:

1. A mask holder usable in an exposure apparatus for printing a pattern of a mask upon a workpiece and also being usable for conveying and holding the mask, said mask holder comprising:
   a reference member operable as a reference for the positioning of the mask;
   an aperture formed in said mask holder and being adapted to be used when the mask is attracted by vacuum;
   a spring-biased first pressing member operable to press a side of the mask, when it is held by said mask holder, in a direction contacting another side of the mask to said reference member; and
   a spring-biased second pressing member operable to press an upper face of the mask, when it is held by said mask holder, in a direction contacting a lower face of the mask to said aperture.

2. A mask holder according to claim 1, wherein an accommodating portion for accommodating a mask is formed in said mask holder and wherein said first and second pressing members act on the mask when it is accommodated in said accommodating portion.

3. A mask holder according to claim 2, wherein said accommodating portion has a rectangular shape, wherein said mask holder is provided with a plurality of reference members and a plurality of first pressing members, and wherein two side faces of the mask as accommodated in said accommodating portion contact said reference members while other two side faces of the mask contact said first pressing members.

4. A mask holder according to claim 2, wherein said accommodating portion is defined within a frame-like member and wherein said frame-like member is formed with a notch which is serviceable upon loading and unloading the mask to and from said accommodating portion.

5. A mask holder according to claim 4, wherein a plurality of reference bores are formed in said frame-like member, for positioning said mask holder.

6. A mask holder according to claim 1, wherein each of said reference member and said first pressing member has a rotatable roller adapted to engage with a side face of the mask.

7. In a method of holding a mask having a pattern on a mask holder and then on a mask stage by vacuum attraction applied to the mask, the improvements comprising:
   placing the mask on the mask holder;
   placing the mask holder on the mask stage, so that a passageway formed in the mask holder is communicated with a passageway formed in the mask stage; and
   applying vacuum through the communicated passageways of the mask stage and the mask holder to the mask,
   whereby the mask can be held on the mask holder and then on the mask stage by using a single vacuum source.

8. A method according to claim 7, wherein the mask holder in which the mask is accommodated is conveyed to the stage by a conveying table, while being held at a fixed position with respect to the conveying table.

* * * * *